United States Patent [19]
Lind

[11] 3,944,417
[45] Mar. 16, 1976

[54] PROCESS FOR THE ELECTROPHOTOGRAPHIC PRODUCTION OF PRINTING PLATES

[75] Inventor: Erwin Lind, Auringen uber Wiesbaden, Germany

[73] Assignee: Hoechst Aktiengesellschaft, Germany

[22] Filed: Mar. 25, 1974

[21] Appl. No.: 454,274

Related U.S. Application Data

[63] Continuation of Ser. No. 879,512, Nov. 24, 1969, abandoned.

[30] Foreign Application Priority Data

Nov. 27, 1968  Germany.............................. 1811209

[52] U.S. Cl...................... 96/1 R; 96/1.5; 96/35.1; 96/36; 96/36.3; 96/115 P
[51] Int. Cl.². G03G 13/22; G03C 1/70; G03C 5/00
[58] Field of Search................ 96/1 R, 1.5, 35.1, 36, 96/115 P

[56] References Cited
UNITED STATES PATENTS

| | | | |
|---|---|---|---|
| 2,760,863 | 8/1956 | Plambeck | 96/35.1 X |
| 2,939,787 | 6/1960 | Giamo | 96/1 R |
| 3,201,237 | 8/1965 | Cerwonka | 96/35.1 |
| 3,257,203 | 6/1966 | Sus et al. | 96/1.5 |
| 3,297,440 | 1/1967 | Delzenne | 96/115 P |

FOREIGN PATENTS OR APPLICATIONS

| | | | |
|---|---|---|---|
| 566,795 | 1/1945 | United Kingdom | 96/35.1 |

*Primary Examiner*—Roland E. Martin, Jr.
*Attorney, Agent, or Firm*—James E. Bryan

[57] ABSTRACT

This invention relates to an electrophotographic process for the production of a printing form which comprises electrostatically charging a supported photoconductive and photopolymerizable layer, exposing the charged layer to light under a master, developing the resulting latent image with an electroscopic material, again exposing the layer to light, and removing the developed image areas from the support.

4 Claims, No Drawings

PROCESS FOR THE ELECTROPHOTOGRAPHIC PRODUCTION OF PRINTING PLATES

This is a continuation, of application Ser. No. 879,512, filed Nov. 24, 1969, now abandoned.

This invention relates to a process for the electrophotographic production of printing forms.

Processes are known for the electrophotographic production of printing forms in which an electrophotographic layer is applied to a metallic support, the layer is electrostatically charged in the absence of light and then image-wise exposed to light. The electrostatic charge image produced on the photoconductive layer is then developed with a toner. By heat treatment, the areas of the layer corresponding to the image areas of the original, on which the toner has deposited, are then made resistant to the action of a liquid solvent for the layer. Subsequent treatment with the dissolving liquid effects baring of the support material in the areas corresponding to the non-image areas of the original. When using aluminum as the support material, a planographic printing form is obtained and, when using zinc or magnesium, relief printing forms are obtained after subsequent etching. These known processes and materials are generally positive-working.

For some fields of application, however, a negative-working process and a negative-working material are of interest, e.g. in the re-enlargement of microfilm negatives directly onto a printing plate or in the production of multi-metal and copper intaglio printing plates.

A negative reproduction process is known in electrophotography. For developing the latent charge image, this process uses a toner which is electrostatically charged with the same polarity as the charged unexposed areas of the photoconductive layer. The toner particles are repelled by the charged areas and the image obtained is a negative of the original. This process has the disadvantage, however, that true copies of the original cannot be obtained when reproducing large image areas. The method known from the positive reproduction process for the development of full shades by means of an electrode with bias voltage also does not succeed in the negative process. But especially in the production of printing forms, the requirements of quality and true reproduction are very high.

The negative-working electrophotographic reproduction process of the present invention is excellently suitable for the production of printing forms. The process uses light-sensitive layers which are simultaneously photoconductive and photopolymerizable. The layers, charged, exposed, and developed with a well covering toner, in the conventional manner, are subjected to a second exposure to light, the developed image areas are dissolved away, and, if desired, the plate is etched.

The reproduction layer may contain, for example, heterocyclic organic compounds of the general formula

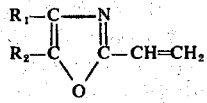

in which $R_1$ is phenyl or dialkyl aminophenyl, and $R_2$ is phenyl or chlorophenyl.

Compounds of this type are described in German Pat. No. 1,120,875.

The production of the printing plates is performed in known manner with the use of binders, sensitizers, and other known additives, as described in the above-mentioned patent, for example. The binder used advantageously is soluble in aqueous alkaline solvents, e.g. copolymers of styrene and maleic acid anhydride.

Reproduction layers of the above-described type may be applied to various supports, depending upon the intended use.

Particularly suitable for the production of planographic printing forms are aluminum foils, but also specially prepared papers and plastic films. It is also possible, however, to apply the reproduction layer to a copper cylinder for the production of an intaglio printing form. Also, bi- and trimetal plates as are conventional for printing may be provided with the reproduction layer.

According to the processes usual in electrophotography, the reproduction layer is then electrostatically charged, episcopically or diascopically exposed to light, and developed with a well covering black toner. It is not necessary to fix the toner image for further processing.

The reproduction layer provided with an image in this manner is then subjected to another exposure to light. In the areas of the reproduction layer which are not covered by the toner, polymerization of the photopolymerizable compound present in the reproduction layer occurs. A differentiation in the solubility between the after-exposed areas of the reproduction layer and the areas covered by the toner is obtained.

After-exposure to light is performed by means of the light sources conventional in the reproduction field, such as carbon arc lamps, xenon lamps, high-pressure mercury lamps, and the like. The duration of after-exposure to light depends upon the intensity and the distance of the light source and is at most 1 to 2 minutes.

The toner image and the underlying reproduction layer are then removed by means of a suitable solvent. The type of solvent depends upon the binder present in the reproduction layer. The areas of the reproduction layer which have been photopolymerized during after-exposure to light are insoluble. The visible image obtained is a negative of the original.

When using a copper or a multimetal plate as the supporting material, the production of the corresponding printing form further requires a metal etching process. It has been found that the image obtained by photopolymerization is excellently resistant to the etchants generally used for this process.

By means of the process of the invention, it is possible to produce, in a rapid and flawless manner, printing forms requiring a negative-working system.

The invention will be further illustrated by reference to the following specific examples:

EXAMPLE 1

A solution of 5.76 parts by weight of 2-vinyl-4-(4'-diethyl-aminophenyl)-5-(2'-chlorophenyl)-oxazole, 2.47 parts by weight of a copolymer of styrene and maleic acid anhydride (Lytron 820, registered trademark of Monsanto), and 0.02 part by weight of Rhodamine FB, in 73.10 parts by weight of methyl glycol, 18.30 parts by weight of butyl acetate, and 0.35 part by weight of methanol is mechanically applied to an aluminum tape superficially roughened by brushing. The layer thickness advantageously is 4 to 5μ. The thoroughly dried layer is negatively charged to 300 volts by means of a corona device. The charged plate is exposed to light in an enlargement device of conventional construction. The exposure time depends on the light source, the density of the original, the stop, and the enlargement scale. When the original is a 35 mm microfilm negative of a technical drawing which is to be enlarged to size DIN A 4, for example, it is in the range of 60 seconds at stop 11 using a 150 watt lamp as the light source. The latent charge image obtained by exposure to light is developed in known manner with a mixture of iron powder and a positively charged carbon black pigment (toner), as is conventional in electrophotography. For development, there is employed a magnetic roller operated, if desired, by a bias voltage for achieving development of full shades free from scumming. After development, the plate is afterexposed for 2 minutes at a distance of 50 cm to a 15 ampere carbon arc lamp.

The areas of the layer covered by the toner then are dissolved away by using a solution of 2.41 parts by weight of sodium metasilicate in 17.70 parts by weight of ethylene glycol, 11.28 parts by weight of glycerol, 14.35 parts by weight of methanol, and 54.26 parts by weight of water. A positive image consisting of photopolymerized oleophilic image areas on a hydrophilic aluminum foil is obtained, from which prints can be made.

EXAMPLE 2

A trimetal plate consisting of a coppered and chromplated aluminum foil is coated with the solution of a substituted vinyl oxazole described in Example 1. The layer is thoroughly dried and electrostatically charged negatively in the absence of light. The charged plate is placed in the cassette of a production camera; the original is a positive. The plate is exposed to light in the conventional manner, the exposure time being about 30 seconds, depending upon the light source, the master, the stop, and the scale. Further procedure is as described in Example 1. After the removal of the unpolymerized photoconductive layer, an image of the photopolymerized vinyl oxazole, which is a negative of the original, is obtained on a hydrophilic chromium layer. By means of a commercial etching solution, the chromium layer is now removed in the uncovered areas so that the copper layer beneath is bared. After completing the etching procedure, the photopolymerized layer is removed with an organic solvent, e.g. acetone. A positive image of oleophilic copper, from which prints can be made, is obtained. The printing runs are very long.

EXAMPLE 3

Instead of the trimetal plate described in Example 2, it is also possible to equally successfully use a bimetal plate of chromium and brass. Exposure to light also may be performed according to the contact process using a film original. When using a 100 watt incandescent bulb at a distance of 60 cm, the exposure time is 2 seconds. Development of the latent charge image obtained by exposing the charged plate to light is performed with a dispersion of carbon black in an aliphatic hydrocarbon, but the dispersed carbon black particles must have a positive charge. The commercially available product of this type may be used. Further procedure is the same as that described in Example 2.

EXAMPLE 4

A solution of 4.2 parts by weight of 2-vinyl-4-(4'-diethyl-aminophenyl)-5-(2'-chlorophenyl)-oxazole, 1.8 parts by weight of a maleic resin having an acid number of 200 (Alresat 444 C, registered trademark of Chemische Werke Albert, Wiesbaden-Biebrich, Germany), and 0.02 part by weight of Rhodamine FB, in 9.6 parts by weight of glycol monomethyl ether, 8.7 parts by weight of toluene, and 14.7 parts by weight of trichloroethylene, is applied to a superficially roughened aluminum foil. After removal of the solvent, the resulting layer is negatively charged by means of a corona discharge and exposed to light, under a negative screen original, by the contact process. The exposure time is about 3 seconds, using a 100 watt incandescent lamp. The latent charge image is developed with a positively charged carbon black pigment. A carbon arc lamp serves for photopolymerization of the uncovered image parts. The layer is dissolved away in the unpolymerized areas and the hydrophilic aluminum surface is thus bared for printing. The solution for removing the layer is prepared by dissolving 27 parts by weight of sodium metasilicate.9 $H_2O$ and 18 parts by weight of trisodium phosphate.12 $H_2O$ in 500 parts by weight of water and 50 parts by weight of ethanol.

EXAMPLE 5

A superficially roughened aluminum foil is coated with a solution prepared by dissolving 6.3 parts by weight of 2-vinyl-4-(4'-diethyl-aminophenyl)-5-(2'-chlorophenyl)-oxazole, 2.7 parts by weight of a phenolformaldehyde resin (Alnovol 429 K, registered trademark of Chemische Werke Albert, Wiesbaden-Biebrich, Germany), and 0.03 part by weight of Rhodamine FB, in 9.6 parts by weight of glycol monomethyl ether, 8.7 parts by weight of toluene, and 14.7 parts by weight of trichloroethylene. Further procedure is the same as in Example 4. For removing the unpolymerized areas of the photoconductive layer, there is employed a solution of 4.5 parts by weight of sodium metasilicate.9 $H_2O$ in 33 parts by weight of ethylene glycol, 20.8 parts by weight of glycerol, 26.7 parts by weight of methanol, and 15.0 parts by weight of water. A positive planographic printing form is obtained from a negative master.

It will be obvious to those skilled in the art that many modifications may be made within the scope of the present invention without departing from the spirit thereof, and the invention includes all such modifications.

What is claimed is:

1. A negative-working reproduction process for the production of a printing form which comprises charging a supported homogeneous layer, exposing the charged layer to light under a master, developing the resulting latent image with an electroscopic material, again exposing the layer to light for not more than about 2 minutes, and removing the developed image areas from the support, said layer consisting essentially of a simultaneously photoconductive and photopolymerizable compound of the formula

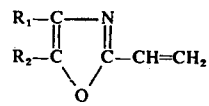

in which $R_1$ is dialkylaminophenyl and $R_2$ is selected from the group consisting of phenyl or chlorophenyl.

2. A process according to claim 1 in which the bared areas of the support are etched.

3. A process according to claim 1 in which the layer contains a binder soluble in aqueous alkaline solvents.

4. A process according to claim 1 in which the layer contains 2-vinyl-4-(4'-diethylaminophenyl)-5-(2'-chlorophenyl)-oxazole.

* * * * *